US008853027B2

(12) United States Patent
Hong et al.

(10) Patent No.: US 8,853,027 B2
(45) Date of Patent: Oct. 7, 2014

(54) SPLIT GATE FLASH CELL

(71) Applicant: Freescale Semiconductor, Inc., Austin, TX (US)

(72) Inventors: Cheong Min Hong, Austin, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/633,124

(22) Filed: Oct. 1, 2012

(65) Prior Publication Data

US 2014/0091380 A1    Apr. 3, 2014

(51) Int. Cl.
*H01L 29/792* (2006.01)
*H01L 29/78* (2006.01)
*H01L 29/66* (2006.01)

(52) U.S. Cl.
CPC .......... *H01L 29/78* (2013.01); *H01L 29/66477* (2013.01)
USPC .......... 438/267; 438/266; 438/264; 438/593; 438/594; 257/321; 257/324

(58) Field of Classification Search
CPC ................... H01L 29/42332; H01L 29/42348; H01L 29/7883; H01L 29/792; H01J 27/11563; H01J 27/1157; H01J 27/11524; H01J 27/11521
USPC ......... 438/264, 265, 266, 267, 591, 593, 594; 257/321, 324
See application file for complete search history.

(56) References Cited

U.S. PATENT DOCUMENTS

| | | |
|---|---|---|
| 5,917,214 A | 6/1999 | Sung |
| 6,093,608 A | 7/2000 | Lin et al. |
| 6,573,555 B1 | 6/2003 | Lin et al. |
| 2007/0001218 A1 | 1/2007 | Hong et al. |
| 2007/0018222 A1 | 1/2007 | Sadd et al. |
| 2007/0018229 A1 | 1/2007 | Yater et al. |
| 2007/0018232 A1 | 1/2007 | Chindalore et al. |
| 2007/0018240 A1 | 1/2007 | Chindalore et al. |
| 2007/0020820 A1 | 1/2007 | Chindalore et al. |
| 2007/0020831 A1 | 1/2007 | Chindalore et al. |
| 2007/0020849 A1 | 1/2007 | Hong et al. |
| 2007/0020851 A1 | 1/2007 | Hong et al. |
| 2007/0020856 A1 | 1/2007 | Sadd et al. |
| 2007/0054452 A1 | 3/2007 | Hong et al. |
| 2007/0134867 A1 | 6/2007 | Sadd et al. |
| 2007/0218669 A1 | 9/2007 | Li et al. |
| 2008/0173921 A1 | 7/2008 | Li et al. |
| 2008/0173922 A1 | 7/2008 | Hong et al. |
| 2008/0173923 A1 | 7/2008 | Li et al. |
| 2008/0199996 A1* | 8/2008 | Muralidhar et al. .......... 438/265 |
| 2009/0256186 A1* | 10/2009 | Kang et al. .................... 257/314 |

(Continued)

*Primary Examiner* — Matthew W Such
*Assistant Examiner* — Scott Stowe

(57) ABSTRACT

In one aspect, a disclosed method of fabricating a split gate memory device includes forming a gate dielectric layer overlying an channel region of a semiconductor substrate and forming an electrically conductive select gate overlying the gate dielectric layer. The method further includes forming a counter doping region in an upper region of the substrate. A proximal boundary of the counter doping region is laterally displaced from a proximal sidewall of the select gate. The method further includes forming a charge storage layer comprising a vertical portion adjacent to the proximal sidewall of the select gate and a lateral portion overlying the counter doping region and forming an electrically conductive control gate adjacent to the vertical portion of the charge storage layer and overlying the horizontal portion of the charge storage layer.

18 Claims, 4 Drawing Sheets

(56) References Cited

U.S. PATENT DOCUMENTS

| | | |
|---|---|---|
| 2009/0296491 A1 | 12/2009 | Hong et al. |
| 2010/0096686 A1 | 4/2010 | Li et al. |
| 2010/0155824 A1 | 6/2010 | Hong et al. |
| 2010/0244121 A1 | 9/2010 | Loiko et al. |
| 2011/0073936 A1 | 3/2011 | Hong et al. |
| 2011/0165749 A1 | 7/2011 | Winstead et al. |
| 2011/0207274 A1* | 8/2011 | Kang et al. .................. 438/258 |
| 2012/0261769 A1 | 10/2012 | Hong et al. |

* cited by examiner

| | CG | SG | D | S |
|---|---|---|---|---|
| SELECTED ROW, SELECTED COLUMN | 9 | 1.2 | 0 | 5 |
| SELECTED ROW, UNSELECTED COLUMN | 9 | 1.2 | 1.2 | 5 |
| UNSELECTED ROW, SELECTED COLUMN | 9 | 0 | 0 | 5 |
| UNSELECTED ROW, UNSELECTED COLUMN | 9 | 0 | 1.2 | 5 | ns on a selected cell.

SPLIT GATE FLASH CELL

BACKGROUND

1. Field

The disclosed subject matter is in the field of semiconductor devices and fabrication and, more particularly, semiconductor devices employing split gate memory cells to form non volatile memory.

2. Related Art

Split gate non-volatile memories (NVMs) including, for example, split gate flash devices, provide advantages over stacked-gated devices, in which the control gate is positioned over the floating gate. Split gate flash cells exhibit reduced program disturb for memory cells that are unselected but are either on the selected row or in the alternative on the selected column. Normally cells on the selected row or the selected column are the most likely to exhibit disturb effects regardless of the operation that is being performed on a selected cell. While split gate flash cells have substantially reduced the program disturb problem for cells on the selected rows or columns, split gate flash cells may exhibit a disturb problem with cells on unselected rows and unselected columns. One of the reasons that unselected cells are susceptible in split gate designs is that the particular stress applied to unselected cells is applied for many more cycles than the stress that is applied to cells on a selected row or a selected column.

BRIEF DESCRIPTION OF THE DRAWINGS

The present invention is illustrated by way of example and is not limited by the accompanying figures, in which like references indicate similar elements. Elements in the figures are illustrated with an emphasis on clarity and simplicity where possible and have not necessarily been drawn to scale.

DETAILED DESCRIPTION

In one aspect, a disclosed method of fabricating a split gate memory device includes forming a gate dielectric layer overlying an active region or a channel region of a semiconductor substrate and forming an electrically conductive select gate overlying the gate dielectric layer. The method further includes forming a counter doping impurity distribution in an upper region of the substrate. A proximal boundary of the counter doping impurity distribution is laterally displaced from a proximal sidewall of the select gate. The method further includes forming a charge storage layer comprising a vertical portion adjacent to the proximal sidewall of the select gate and a lateral portion overlying the counter doping impurity distribution and forming an electrically conductive control gate adjacent to the vertical portion of the charge storage layer and overlying the horizontal portion of the charge storage layer.

In another aspect, a disclosed semiconductor storage device includes a gate dielectric layer overlying an upper surface of a well in a semiconductor substrate, an electrically conductive select gate overlying the gate dielectric layer, and a counter doping impurity distribution occupying an upper region of the substrate, wherein a proximal boundary of the counter doping impurity distribution is laterally displaced with respect to a proximal sidewall of the select gate. The device includes a charge storage layer including a vertical portion adjacent to the proximal sidewall of the select gate and a lateral portion overlying the counter doping impurity distribution, an electrically conductive control gate overlying the charge storage layer.

In still another aspect a disclosed semiconductor fabrication process includes forming a gate dielectric overlying an upper surface of the substrate, forming an electrically conductive select gate overlying the gate dielectric, and forming a displacement structure on a sidewall of the select gate. The method may further include forming a counter doping impurity distribution in the semiconductor substrate laterally aligned to a sidewall of the displacement structure, forming a charge storage layer including a plurality of nanoclusters, and forming a control gate electrode overlying the charge storage layer.

Figures 1, 2:
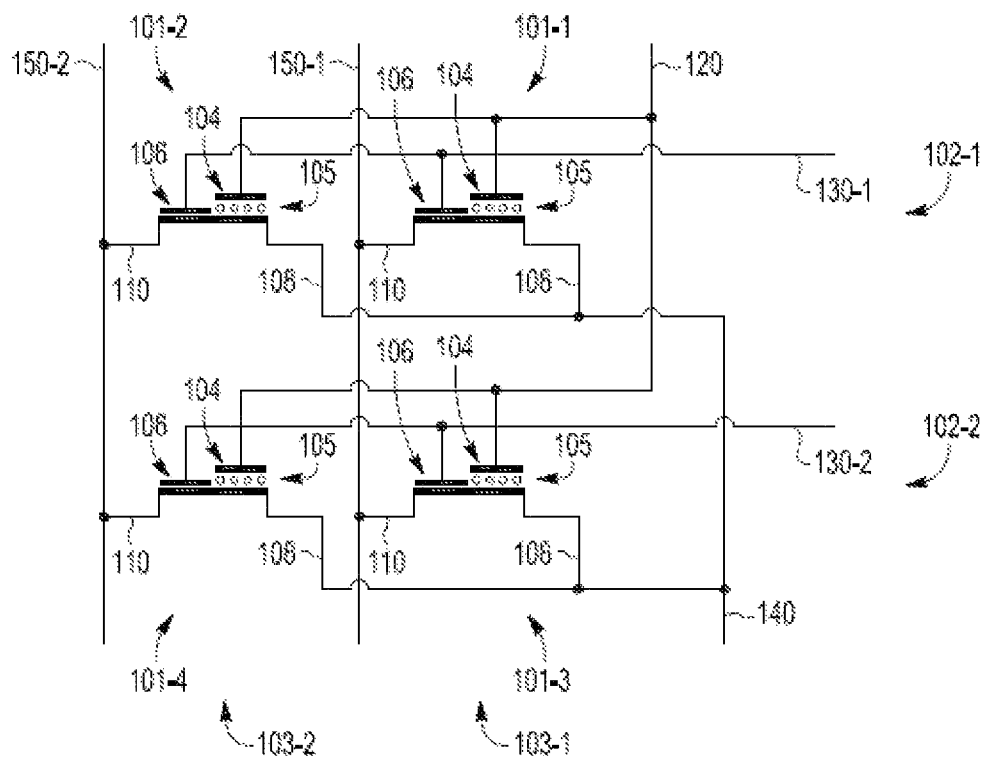
FIG. 1 depicts a portion of a split gate array according to one embodiment.
FIG. 2 is a programming voltage table indicating example biasing conditions for different cells during programming.

Turning now to the drawings, FIG. 1 depicts selected elements of a portion of a split gate flash cell array 100. Array 100 as shown in FIG. 1 includes four split gate cells 101-1 through 101-4. Split gate cells 101-1 and split gate cell 101-2 are on a first row 102-1 of array 100 while split gate cells 101-3 and 101-4 are on a second row 102-2 that is adjacent to first row 102-1. Similarly, split gate cells 101-1 and 101-3 are on a first column 103-1 while split gate cells 101-2 and 101-4 are on a second column 103-2 of array 100.

Each split gate cell 101 includes a control gate 104 and a select gate 106. Control gate 104 includes a charge storage element 105. Charge storage element 105 may represent nanoclusters or nanocrystals as described below. In other embodiments, not depicted, a traditional floating gate structure, e.g., an ONO structure or a floating polysilicon gate, may be used to implement charge storage elements 105.

A control gate signal 120 is connected to the control gate 104 of each of the split gate cells 101. Select gate signals 130-1 and 130-2 are connected to the select gates 106 of the split gate cells 101 in the applicable row 102. Thus, for example, select gate signal 130-1 is connected to the select gates 106 of the split gate cells 101 in first row 102-1 while select gate signal 130-2 is connected to the select gates 106 of the split gate cells 101 in second row 102-2.

Each split gate cell 101 further includes a source terminal 108 and a drain terminal 110. In the embodiment of array 100 as depicted in FIG. 1, a source signal 140 is applied to each of the source terminal 108 of each split gate cell 101.

The drain terminals 110 of each split gate cell 101 are connected to a bit line 150. In the embodiment of array 100 depicted in FIG. 1, a first bit line 150-1 connects to the drain terminals 110 of split gate cells 101-1 and 101-3 in first column 103-1. Similarly, a second bit line 150-2 connects to the drain terminals 110 of split gate cells 101-2 and 101-4 in second column 103-2 of array 100.

While the configuration of split gate cells 101 in array 100 beneficially improves disturb immunity for rows and columns that are selected during programming, the disturb immunity for rows and columns that are not selected may be problematic due to high electric fields created across relatively narrow dielectric films. If, for example, split gate cell 101-4 is being programmed, second row 102-2 is the selected row and second column 103-2 is the selected column. Thus, first split gate cell 101-1 is on an unselected row, first row 102-1, and an unselected column, first column 103-1, during the programming of split gate cell 101-4. Although programming voltages for any flash memory device are implementation specific, programming voltages that might be suitable for split gate cells 101 in array 100 as shown in FIG. 1 are listed in the table 150 depicted in FIG. 2. As listed in FIG. 2, the programmed cell, i.e., the cell on the selected row and selected column, receives a 9 V control gate signal (120), a 1.2 V select gate signal (130), a 5 V source terminal signal (140), and a 0 V drain terminal signal (150).

At the same time, a cell 101 that is on an unselected row and an unselected column receives a 9 V control signal (120), a 0 V select gate signal (130), a 5 V source terminal signal (140), and a 1.2 V drain signal (150). Under these biasing conditions, the electric field in the channel can become so large in magnitude that inadvertent programming of the cell may occur due to carrier generation from band to band tunneling. Subject matter disclosed herein may reduce the magnitude of the maximum electric field by positioning a counter doping region of the substrate laterally displaced from a gap edge of the select gate so that the counter doping region does not significantly infringe upon a gap region of the substrate. The substrate gap region corresponds to a portion of the substrate between a gap edge of the selected gate and a gap edge of the control gate. By reducing the maximum electric field in the channel, band to band tunneling is reduced and program disturb tolerance increases.

Turning now to FIG. 3 through FIG. 7, selected steps from embodiments of fabrication processes that produce split gate memory cell devices exhibiting robust program disturb immunity on unselected rows and unselected columns are presented. The following figures describe two implementations. In both implementations, some form of displacement structure is formed on a sidewall of the select gate that is proximal to the split-gate gap, prior to introducing a counter doping impurity distribution into the substrate. In the embodiment depicted in FIG. 4 through FIG. 6, the displacement structure is formed by thermally oxidizing polysilicon on the select gate sidewall proximal to the gap. In the second implementation, described below with respect to FIG. 7, the displacement structure is formed by depositing a conformal dielectric over the select gate and thereafter anisotropically etching the deposited layer to produce spacers on sidewalls of the select gate, including a spacer on the gap-side sidewall of the select gate.

Figure 3:
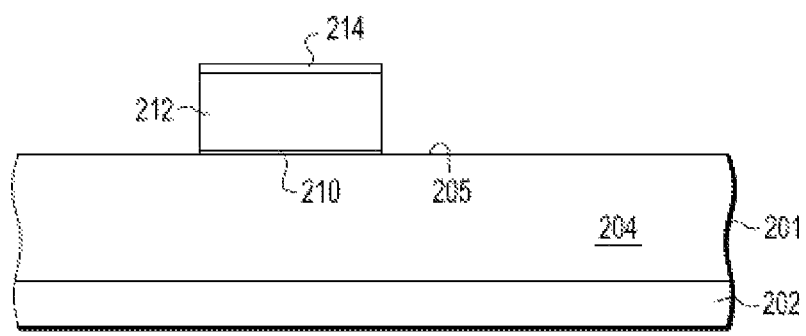
FIG. 3 depicts a cross section of a wafer at a selected stage in an embodiment of a fabrication processor.

Referring now to FIG. 3, selected elements of one embodiment of a partially completed split gate cell 101 are depicted in cross section. FIG. 3 through FIG. 6 depict aspects of an embodiment of a semiconductor fabrication process by depicting split gate cell 101 at various stages in the process. In these depictions, split gate cell 101 is a portion of a semiconductor wafer 201 that includes a well 204 overlying a substrate 202.

Semiconductor wafers such as semiconductor wafer 201 are well known in the field of semiconductor fabrication and may include well known elements or features that are not depicted. For example, substrate 202 may include an insulating layer, sometimes referred to as a buried oxide layer, and, in these embodiments, wafer 201 may be referred to as a semiconductor on insulator (SOI) wafer. Similarly, substrate 202 may include one or more epitaxial layers formed overlying a semiconductor bulk region.

The bulk region of wafer 201 may be a conventional, monocrystalline silicon substrate and epitaxial layers may include homoepitaxial layers of p-type silicon and n-type silicon, or heteroepitaxial layers of another semiconductor or an insulating material. Semiconductor wafer 201 may further include isolation structures including, as examples, shallow trench isolation (not depicted) to provide physical and electrical isolation between adjacent devices.

FIG. 3 depicts well 204 overlying substrate 202, and a select gate 212 formed overlying a channel region of well 204. The gate dielectric 210 is formed overlying an upper surface 205 of wafer 201. Gate dielectric 210 may be a thermally formed silicon dioxide gate dielectric. In other embodiments, gate dielectric 210 may be a high-k dielectric compound or some other form of dielectric. In some embodiments, select gate 212 is or includes polysilicon. In other embodiments, select gate 212 may include additional materials such as a silicide layer formed overlying a polysilicon layer. In still other embodiments, select gate 212 may include a metal or other electronic electrically conductive material such as Ta, TaN or the like.

As depicted in FIG. 3, a hard mask 214 is shown formed overlying select gate 212. Hard mask 214 may be comprised of silicon nitride or another material that is resistant to oxidation processes and is highly etch selective with respect to crystalline and polycrystalline silicon, silicon dioxide, and other material in select gate 212 and well 204. Although dimensions are implementation specific, a thickness of gate dielectric 210 may be in the range of approximately 2 to 8 nanometers (nm), a lateral dimension of select gate 212 may be in the range of approximately 0.05 to 0.2 microns, and a height of select gate 212 may be in the range of approximately 50 to 150 nm.

With respect to implementations in which select gate 212 comprises polysilicon, select gate 212 may be p-type or n-type polysilicon. Similarly, well 204 may be an n-type or p-type well region and substrate 202 may be an n-type or p-type substrate. For purposes of simplifying the following description, the figures will be described with respect to a n-type transistor in which well 204 is a p-type region and select gate 212 is an n-type region. Of course, it will be appreciated that other implementations may employ the conductivity types that are the opposite of the conductivity types described herein.

The fabrication of select gate 212, gate dielectric 210, and hard mask 214 may all be achieved using conventional semiconductor fabrication processes including, as examples, the thermal growth of silicon dioxide to create gate dielectric 210, the chemical vapor deposition of polysilicon to create select gate 212, and the deposition of silicon nitride to create hard mask 214, as well as conventional photolithography and etch processes to pattern the deposited films into the structures depicted in FIG. 3.

Figure 4:
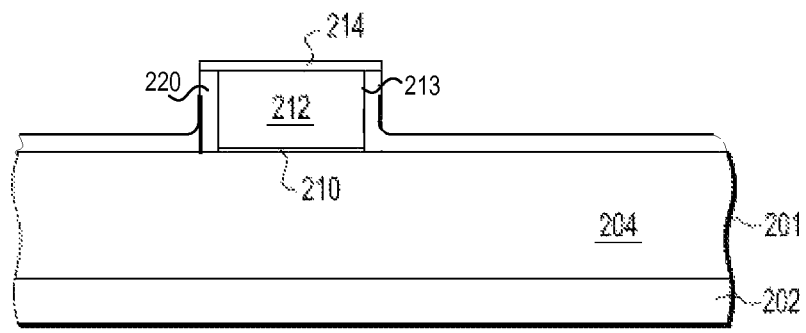
FIG. 4 depicts processing subsequent to FIG. 3.

Referring now to FIG. 4, displacement structures 220 are shown formed on sidewalls of select gate 212. In the embodiment depicted in FIG. 3, the formation of displacement structures 220 is achieved by thermal oxidation of select gate 212. In this embodiment, at least a portion of select gate 212 is a polysilicon select gate and wafer 201 is exposed to an oxygen-bearing ambient maintained at a temperature in the range of approximately 800 to 1100 degrees centigrade for a duration in the range of approximately 10 to 30 minutes.

The oxidation of select gate 212 oxidizes sidewalls of select gate 212 and results in a reduction in the lateral dimension of select gate 212. The thickness of displacement structure 220, in turn, directly impacts the displacement between select gate sidewall 213, which may also referred to herein as gap-side sidewall 213 or proximal sidewall 213 and the counter doping impurity distribution described below. Although specific dimensions are implementation details, a thickness of displacement structure 220 may be in the range of approximately 10 to 50 nm.

Figure 5:
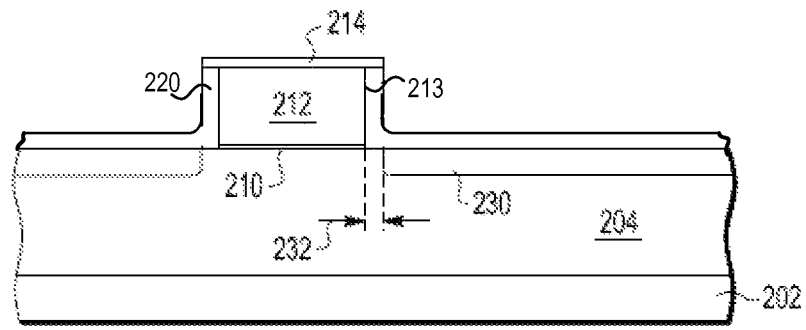
FIG. 5 depicts processing subsequent to FIG. 4.

Referring now to FIG. 5, a counter doping impurity distribution 230 is introduced into well 204 of substrate 202. In some embodiments, ion implantation is used to introduce counter doping impurity distribution 230. As depicted in FIG. 5, counter doping impurity distribution 230 is aligned to an edge of displacement structure 220. In this embodiment, counter doping impurity distribution 230 is laterally displaced from proximal sidewall 213 of select gate 212 by a displacement indicated in FIG. 5 by reference numeral 232.

In embodiments that include a p-type well 204, counter doping impurity distribution 230 may be an n-type impurity distribution. In these embodiments, the specific species used to implant counter doping impurity distribution 230 may be any of: phosphorus, arsenic, or antimony. Moreover, although different implementations may employ different configurations, a depth of counter doping impurity distribution 230 may be in the range of approximately 20 to 80 nm and a concentration of counter doping impurity distribution 230 may be in the range of approximately $10^{16}$ to $10^{19}$ cm$^{-3}$.

By decreasing the impurity concentration in proximity to a sidewall of select gate 212, counter doping impurity distribution 230 may beneficially reduce band to band tunneling that occurs on unselected rows and columns during programming.

Figure 6:
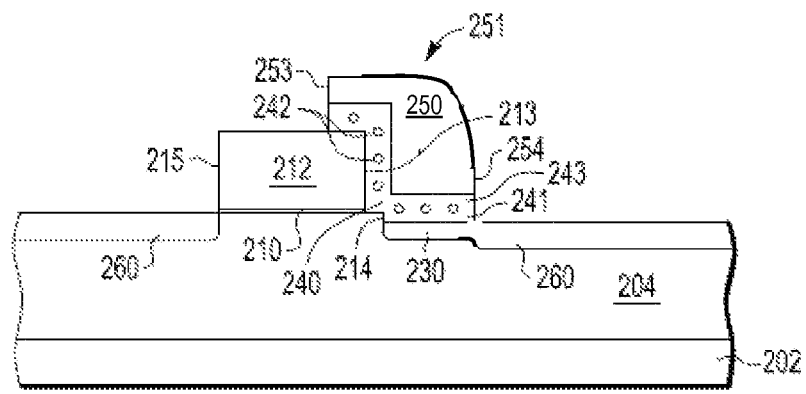
FIG. 6 depicts processing subsequent to FIG. 5.

Referring now to FIG. 6, a control gate structure 251 overlies substrate 204 adjacent to proximal sidewall 213 of select gate 212 and includes a portion overlying an upper surface of select gate 212. In the depicted embodiment, control gate structure 251 includes a storage layer 240 underlying a control gate electrode 250. The depicted embodiment of storage layer 240 includes charge storage nanoclusters 242. The formation of charge storage layer 240 may include forming a silicon dioxide bottom oxide 241 by thermally oxidizing exposed portions of well 204 and counter doping impurity distribution 230. In this embodiment, it will be appreciated by those of skill in the field of semiconductor fabrication that the thermal oxidation of silicon in well 204 may simultaneously produce a thermally formed silicon dioxide along proximal sidewall 213 and partially overlying an upper of select gate 212. FIG. 6 also depicts that the thermal oxidation of well 204 and counter doping impurity distribution 230 may consume an upper surface of wafer 201 at differing oxidation rates such that a step 214 occurs at a boundary of counter doping impurity distribution 230. In other embodiments, the thermal oxidation of well 204 to create bottom oxide 241 may be performed with the displacement structure 220 in place. In these embodiments, the thermal oxidation rate of underlayer 241 will be higher at the horizontally oriented interface with well 204 and, therefore, the oxidation will occur preferentially at the interface with substrate 201.

After bottom oxide 241 is formed, the formation of the depicted embodiment of storage layer 240 includes the formation of charge storage layer. In some embodiments, the charge storage layer may include a continuous sheet of silicon nitride or another suitable dielectric. In other embodiments, including the embodiment depicted in FIG. 6, the charge storage layer 240 includes a plurality of discrete charge storage elements referred to herein as nanoclusters 242. Nanoclusters 242 are discrete instances of a conductive, semiconductor, or electrically insulating material onto which charge may be injected or otherwise stored. After nanoclusters 242 are formed on bottom oxide 241, a top oxide 243 is deposited or grown to complete the formation of storage layer 240. The formation of bottom oxide 241, nanoclusters 242, and top oxide 243 may be completed as separate processing steps or as a sequence of integrated process steps in a single piece of equipment. A thickness of charge storage layer 240 may be in the range of approximately 3 to 50 nm.

After charge storage layer 240 is formed, the formation of control gate structure 251 may include the formation of an electrically conductive control gate electrode 250. In some embodiments, the formation of control gate electrode 250 may include a polysilicon deposition process. In other embodiments, control gate electrode 250 may include a metal, silicide, or other electrically conductive material.

Control gate structure 251 is preferably patterned as depicted in FIG. 6 wherein a portion of control gate structure 251 overlaps select gate 212 such that a portion of control gate structure 251 overlies an upper surface of select gate 212. In some of these embodiments, control gate structure 251 may overlap select gate 212 sufficiently to cover approximately ⅓ of an upper surface of select gate 212. In some embodiments, a second boundary 254 of control gate structure 251 is aligned to or approximately aligned to a boundary of counter doping impurity distribution 230. Following the formation of control gate structure 251 and select gate 212, lightly doped drain (LDD)/extension regions 260 may be formed in well 204 aligned to boundary 215 of select gate 212 and to boundary 254 of control gate structure 251. For p-type embodiments of well 204, LDD/extension regions 260 are n-type regions. In some embodiments, LDD/extension regions 260 are deeper and have a greater impurity concentration than counter doping region 230.

Figure 7:
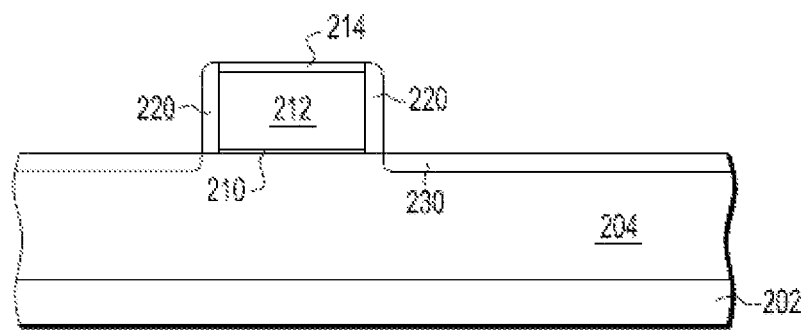
FIG. 7 depicts an alternative to the processing depicted in FIG. 3.

Turning now to FIG. 7 an alternative to the processing depicted in FIG. 4 is shown to describe an embodiment in which, instead of thermally oxidizing select gate 212 to form displacement structure 220, displacement structure 220 is achieved with a dielectric spacer. In these embodiments, the spacer structure may have a lateral dimension approximately equal to the lateral dimension of the displacement structure 220 depicted in FIG. 4 so that the amount of counter doping displacement that displacement structure 220 causes is approximately the same for either implementation of displacement structure 220. The formation of spacing structure 220 is depicted in FIG. 7 is, however, different than the formation of spacing structure 220 in FIG. 4. The formation of spacing structure 220 as depicted in FIG. 7 may include the conformal deposition of a silicon dioxide layer using an oxygen-containing and silicon-containing source material such as tetraethylorthosilicate (TEOS). After depositing the conformal layer, the process for forming spacing structure 220 may include anisotropically etching the conformal layer to selectively etch horizontally oriented aspects of the film and thereby leave behind vertically oriented aspects of the film including the spacers that form on vertically oriented sidewalls including the sidewalls of select gate 212.

After spacing structures 220 have been formed as described with respect to FIG. 7, the formation of a counter doping impurity distribution may proceed substantially in the same manner as the formation of counter doping impurity distribution 230 as shown in FIG. 7. Thereafter, however, the use of a spacer structure may require a different processing sequence to fabricate storage layer 240. For embodiments in which the bottom oxide 241 of storage layer 240 is a thermally formed silicon dioxide, the spacer structure 220 depicted in FIG. 7 may be removed prior to forming bottom oxide 241. For embodiments that use a spacer structure for displacement structure 220, after the spacer is removed, processing may resemble the processing depicted in FIG. 5 and FIG. 6 wherein a thermally formed silicon dioxide or other dielectric is produced overlying counter doping impurity distribution 230 and along vertically oriented sidewall 213.

Figure 8:
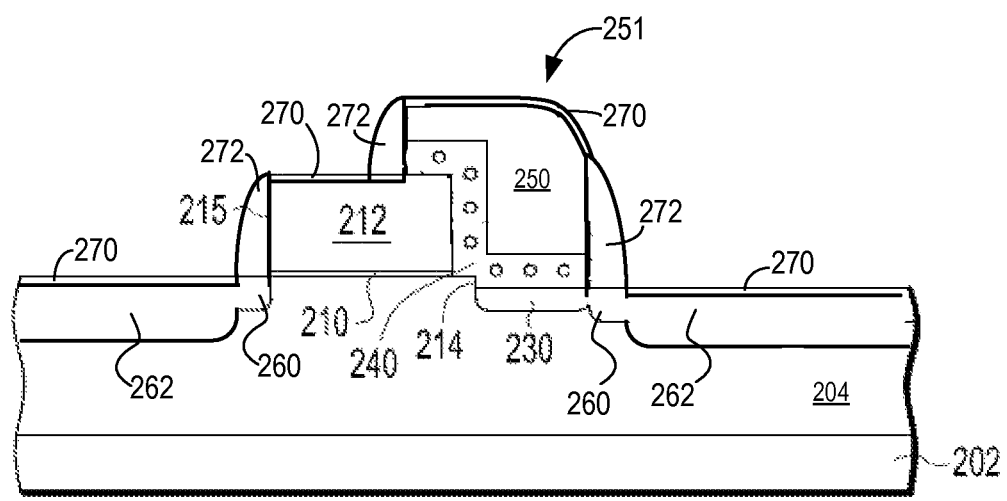
FIG. 8 depicts processing subsequent to FIG. 6.

Turning now to FIG. 8, processing subsequent to the processing depicted in FIG. 6 is illustrated. As depicted in FIG. 8, spacers 272 have been formed on exposed sidewalls of select gate 212 and control gate structure 251, source/drain regions 262 have been implanted into exposed portions of substrate 202, and a silicide layer 270 has been formed on exposed silicon portions of substrate 202, select gate 212, and control gate electrode 250, i.e., silicon portions not covered by spacers 272. Spacers 272 may be formed according to well-known techniques. In some embodiments, for example, spacers 272 may be formed by depositing a conformal layer of silicon nitride or another suitable dielectric and thereafter anisotropically etching the deposited layer to remove portions of the layer overlying horizontally oriented regions of the underlying substrate. As depicted in FIG. 8, the spacer structures 272 that remain occupy regions of the wafer adjacent to vertically oriented services. Source/drain regions 262 are heavily doped regions, i.e., regions having an impurity concentration exceeding $1E19/cm^3$ of the same conductivity type as the LDD/extension regions 260 and a greater depth than LDD/extension regions 260.

Although disclosed subject matter is described herein with reference to specific embodiments, various modifications and changes can be made without departing from the scope of the subject matter as set forth in the claims below. Accordingly, the specification and figures are to be regarded as illustrative rather than restrictive and the modifications and changes referred to are intended to be included within the scope of the present invention. Unless expressly stated otherwise, any benefits, advantages, or solutions to problems that are described herein with regard to specific embodiments are not intended to be construed as critical, required, or essential features or elements of any or all the claims.

Similarly, unless expressly stated otherwise, terms such as "first" and "second" may be used solely to distinguish between different elements such terms describe. Thus, these terms are not necessarily intended to indicate temporal or other prioritization of such elements.

What is claimed is:

1. A method of fabricating a split gate memory device, the method comprising:
   forming an electrically conductive select gate overlying a channel region of a semiconductor substrate;
   forming a counter doping region in an upper region of the substrate outside of the channel region, wherein a proximal boundary of the counter doping region is laterally displaced from a proximal sidewall of the select gate, wherein a conductivity type of the channel region and a first conductivity type of the counter doping region are opposite and wherein an impurity concentration of the counter doping region exceeds an impurity concentration of the channel region;
   forming an extension region aligned to a distal boundary of the select gate;
   forming a heavily doped source/drain region adjacent to the extension region;
   forming a charge storage layer comprising a vertical portion adjacent to the proximal sidewall of the select gate and a lateral portion overlying the counter doping region; and
   forming an electrically conductive control gate adjacent to the vertical portion of the charge storage layer and overlying the horizontal portion of the charge storage layer;
   wherein the extension region and the source/drain region have a conductivity type of the counter doping region and wherein an impurity concentration of the extension region is greater than an impurity concentration of the counter doping region and an impurity concentration of the source/drain region is greater than an impurity concentration of the extension region.

2. The method of claim 1, wherein forming the charge storage layer includes:
   thermally forming a first bottom oxide;
   forming charge storage nanoclusters on the first bottom oxide; and
   forming a second top oxide overlying the charge storage nanoclusters.

3. The method of claim 1, wherein the channel region of the semiconductor substrate has a first conductivity type and wherein the counter doping region has a second conductivity type that is different than the first conductivity type.

4. The method of claim 1, wherein forming the counter doping region includes:
   forming a displacement structure on the proximal sidewall of the select gate; and
   with the displacement structure in place, implanting a counter doping species into a counter doping region of the semiconductor substrate, wherein the counter doping region is laterally aligned to the displacement structure.

5. The method of claim 4, wherein forming the displacement structure comprises thermally oxidizing the proximal sidewall of the select gate.

6. The method of claim 4, wherein forming the displacement structure comprises:
   depositing a dielectric layer conformally overlying the select gate; and
   anisotropically etching the dielectric layer to remove portions of the dielectric layer overlying horizontal regions of the substrate.

7. The method of claim 4, wherein:
   a lateral displacement between the proximal boundary of the counter doping region and the proximal sidewall of the select gate is in the approximate range of 10 to 50 nm;
   a depth of the counter doping region is in the approximate range of 20 to 80 nm; and
   an impurity concentration of the counter doping region is in the approximate range of $10^{16}/cm^3$ to $10^{19}$ atoms/$cm^3$.

8. A semiconductor fabrication process, comprising:
   forming a gate dielectric overlying an upper surface of a semiconductor substrate;
   forming an electrically conductive select gate overlying the gate dielectric and overlying a channel region of the semiconductor substrate wherein the channel region has a first conductivity type;
   forming a displacement structure on a sidewall of the select gate;
   forming a counter doping region of a second conductivity type in the semiconductor substrate laterally aligned to a sidewall of the displacement structure;
   forming a charge storage layer including a plurality of nanoclusters;
   forming a control gate electrode overlying the charge storage layer;
   wherein forming the displacement structure includes:
      depositing a conformal silicon dioxide layer over the select gate; and
      etching the conformal silicon dioxide layer anisotropically to form spacer structures on sidewalls of the select gate.

9. The process of claim 8, wherein depositing the conformal silicon dioxide layer comprises depositing a tetraethylorthosilicate (TEOS) layer.

10. The process of claim 8, wherein forming the counter doping region includes implanting a counter doping species into the substrate.

11. The process of claim 8, wherein forming the charge storage layer comprises:
removing the spacer structures; and
forming a charge storage dielectric overlying an upper surface of the substrate and adjacent a sidewall of the select gate.

12. The process of claim 11, further comprising: forming nanocrystals in the charge storage dielectric.

13. A semiconductor storage device, comprising:
a gate dielectric layer overlying an upper surface of a well in a semiconductor substrate;
an electrically conductive select gate overlying the gate dielectric layer;
a counter doping region occupying an upper region of the substrate, wherein a proximal boundary of the counter doping region is laterally displaced with respect to a proximal sidewall of the select gate;
an extension region aligned to a distal boundary of the select gate;
a heavily doped source/drain region adjacent to the extension region;
a charge storage layer including a vertical portion adjacent to the proximal sidewall of the select gate and a lateral portion overlying the counter doping region; and
an electrically conductive control gate overlying the charge storage layer;
wherein the extension region and the source/drain region have a conductivity type of the counter doping region and wherein an impurity concentration of the extension region is greater than an impurity concentration of the counter doping region and an impurity concentration of the source/drain region is greater than an impurity concentration of the extension region.

14. The device of claim 13, wherein a displacement between the select gate sidewall and the counter doping region exceeds approximately 10 nm.

15. The device of claim 13, wherein the well comprises a 1st-type well and wherein the counter doping region is a second-type impurity distribution.

16. The device of claim 13, wherein an impurity concentration of the counter doping region exceeds a doping concentration of the well.

17. The device of claim 13, wherein a distal boundary of the counter doping region is aligned with a distal boundary of the control gate.

18. The device of claim 13, wherein the charge storage layer includes a plurality of nanoclusters.

* * * * *